(12) United States Patent
Chang

(10) Patent No.: US 11,419,205 B1
(45) Date of Patent: Aug. 16, 2022

(54) CIRCUIT BOARD STRUCTURE AND LAYOUT STRUCTURE THEREOF

(71) Applicant: HTC Corporation, Taoyuan (TW)

(72) Inventor: Che-Jung Chang, Taoyuan (TW)

(73) Assignee: HTC Corporation, Taoyuan (TW)

( * ) Notice: Subject to any disclaimer, the term of this patent is extended or adjusted under 35 U.S.C. 154(b) by 0 days.

(21) Appl. No.: 17/191,708

(22) Filed: Mar. 4, 2021

(51) Int. Cl.
 *H05K 1/02* (2006.01)
 *H05K 1/14* (2006.01)
 *H01L 25/065* (2006.01)

(52) U.S. Cl.
 CPC .............. *H05K 1/025* (2013.01); *H05K 1/144* (2013.01); *H01L 25/0657* (2013.01); *H01L 2225/06572* (2013.01); *H05K 2201/09281* (2013.01); *H05K 2201/09672* (2013.01)

(58) Field of Classification Search
 CPC ............................................ H05K 1/025–0253
 See application file for complete search history.

(56) References Cited

U.S. PATENT DOCUMENTS

| 2015/0016081 A1* | 1/2015 | Auchere | H01L 23/49811 |
| | | | 361/772 |
| 2020/0075509 A1* | 3/2020 | Baek | H01L 23/64 |

FOREIGN PATENT DOCUMENTS

| CN | 105007682 | 10/2015 |
| CN | 110506454 | 11/2019 |

OTHER PUBLICATIONS

"Office Action of Taiwan Counterpart Application", dated Aug. 18, 2021, p. 1-p. 9.

* cited by examiner

*Primary Examiner* — Hoa C Nguyen
(74) *Attorney, Agent, or Firm* — JCIPRNET

(57) ABSTRACT

A circuit board structure and a layout structure thereof are proposed. The layout structure includes at least one signal transmission line, at least one bonding pad, and at least one impedance adjusting wire. The signal transmission line, the bonding pad, and the impedance adjusting wire are disposed on a first circuit board. The impedance adjusting wire is electrically connected between the signal transmission line and the bonding pad. The impedance adjusting wire is disposed along a periphery of the bonding pad, and at least partially surrounds the bonding pad.

9 Claims, 4 Drawing Sheets

CIRCUIT BOARD STRUCTURE AND LAYOUT STRUCTURE THEREOF

BACKGROUND

Technical Field

The disclosure relates to a circuit board structure and a layout structure thereof, and in particular to a circuit board structure, which reduces signal reflection, and a layout structure thereof.

Description of Related Art

In the design of a printed circuit board, in order to allow a signal to be transmitted between circuit boards of different heights, a bonding pad is often used for connecting to a connector, for example, a conductive via, so as to allow an electrical connection to be generated between different circuit boards. However, relative to a transmission line, the bonding pad often has a relatively large surface area and provides relatively low impedance. Therefore, an impedance discontinuity is generated in a signal transmission path formed by the transmission line and the bonding pad, and the impedance discontinuity causes reflection in the signal transmission process and reduces the quality of signal transmission.

SUMMARY

The disclosure provides a circuit board structure, which reduces reflection during signal transmission, and a layout structure thereof.

The circuit board layout structure of the disclosure includes at least one signal transmission line, at least one bonding pad, and at least one impedance adjusting wire. The signal transmission line, the bonding pad, and the impedance adjusting wire are disposed on a first circuit board. The impedance adjusting wire is electrically connected between the signal transmission line and the bonding pad. The impedance adjusting wire is disposed along a periphery of the bonding pad, and at least partially surrounds the bonding pad.

The circuit board structure of the disclosure includes a first circuit board and a second circuit board. The first circuit board has at least one signal transmission line, at least one bonding pad, and at least one impedance adjusting wire. The impedance adjusting wire is electrically connected between the signal transmission line and the bonding pad. The impedance adjusting wire is disposed along a periphery of the bonding pad, and at least partially surrounds the bonding pad. The second circuit board is electrically connected to the second circuit board through at least one connector.

Based on the above, the disclosure is electrically connected between the signal transmission line and the bonding pad through disposing the impedance adjusting wire. In addition, in the disclosure, the impedance adjusting wire is disposed along the periphery of the bonding pad, and at least partially surrounds the bonding pad. In this way, the impedance discontinuity generated in the signal transmission process may be effectively reduced, and the quality of signal transmission may be effectively improved.

DESCRIPTION OF THE EMBODIMENTS

Figure 1:
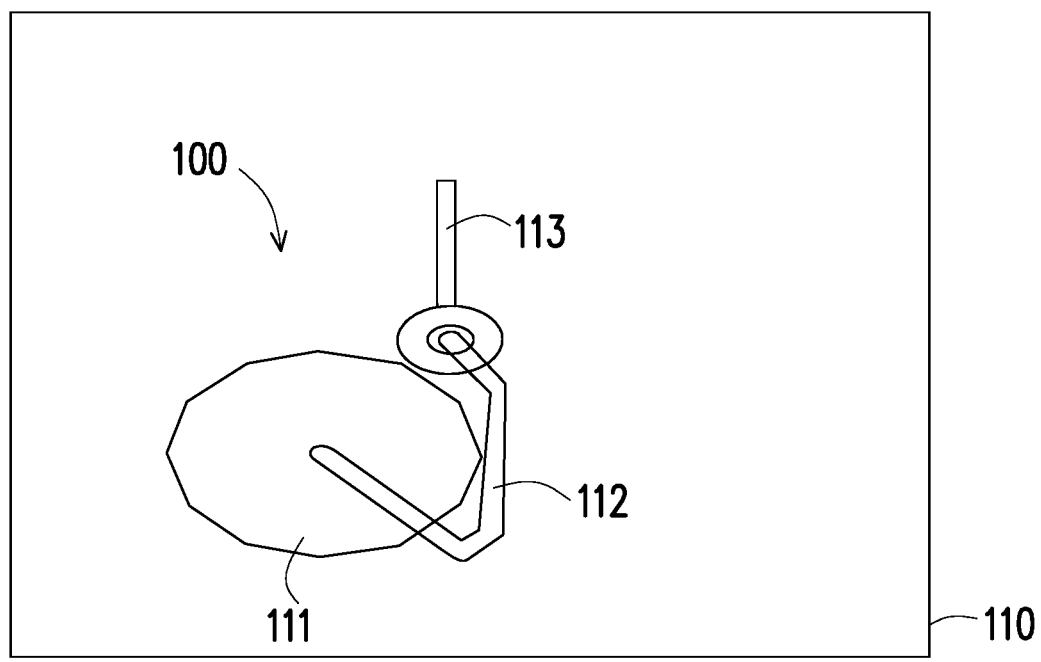
FIG. 1 illustrates a schematic view of a circuit board layout structure according to an embodiment of the disclosure.

Referring to FIG. 1, FIG. 1 illustrates a schematic view of a circuit board layout structure according to an embodiment of the disclosure. A layout structure 100 is disposed on a circuit board 110. The layout structure 100 includes a bonding pad 111, an impedance adjusting wire 112, and a signal transmission line 113. The signal transmission line 113 is electrically connected to one end of the impedance adjusting wire 112, and another end of the impedance adjusting wire 112 is electrically connected to the bonding pad 111. In this embodiment, the bonding pad 111 has a relatively large charge transmitting surface and provides a first impedance. The impedance adjusting wire 112 disposed in the bonding pad 111 and the signal transmission line 113 has a relatively small charge transmitting surface and provides a second impedance. The second impedance is greater than the first impedance.

In this embodiment, the signal transmission line 113 is configured to transmit an electrical signal. The layout structure 100 disposes the impedance adjusting wire 112 between the signal transmission line 113 and the bonding pad 111, and improves a continuity of impedance changes from the signal transmission line 113 to the bonding pad 111 by using the second impedance provided by the impedance adjusting wire 112 that is relatively larger than the first impedance provided by the bonding pad 111. Accordingly, signal reflection that may occur in an electrical signal transmission process may be effectively reduced.

It is to be noted that, in this embodiment, the impedance adjusting wire 112 may be disposed along a periphery of the bonding pad 111. A shape of the bonding pad 111 may be designed to be polygonal or circular. The impedance adjusting wire 112 may be laid out to surround the bonding pad 111 along a polygonal or circular periphery of the bonding pad 111, and have an interval distance with the bonding pad 111. In FIG. 1, the impedance adjusting wire 112 may partially surround the bonding pad 111, for example, surrounding ¼ of a circumference of the bonding pad 111.

In addition, in this embodiment, the bonding pad 111 and the impedance adjusting wire 112 may both be disposed on a same surface of the circuit board 110. In other embodiments of the disclosure, the bonding pad 111 and the impedance adjusting wire 112 may be respectively disposed on different surfaces of the circuit board 110.

Incidentally, in this embodiment, the bonding pad 111 may be electrically connected to a connector and electrically connected to another circuit board through the connector. The connector may be any form of conductive via.

Figure 2A:
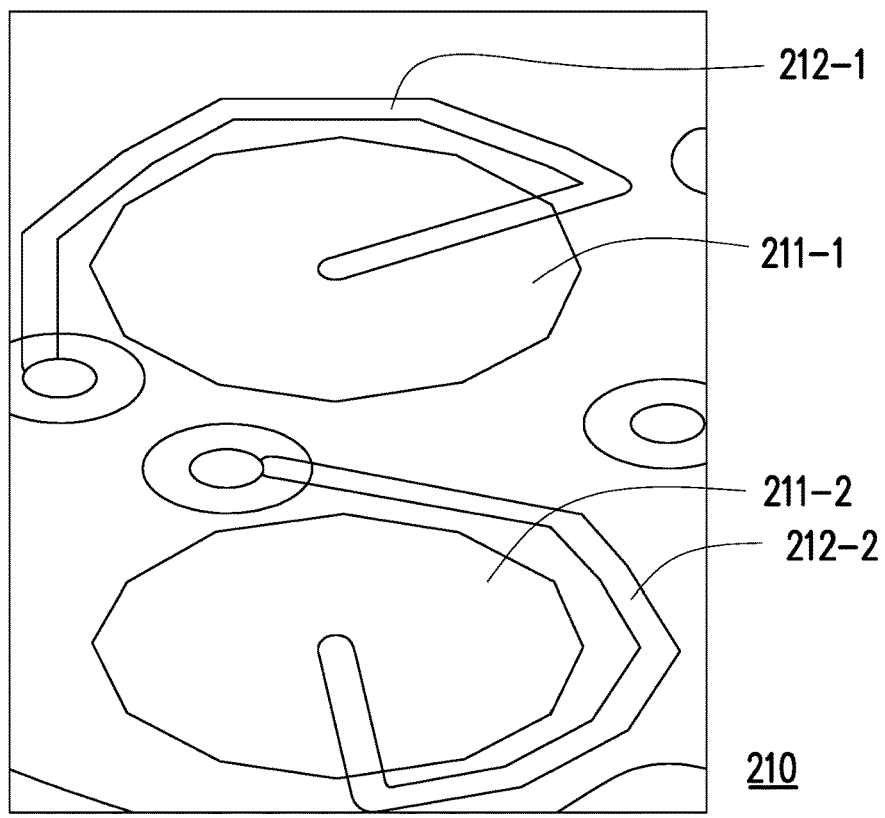
FIGS. 2A and 2B respectively illustrate schematic views of different implementation methods of the layout structure according to an embodiment of the disclosure.
Figure 2B:
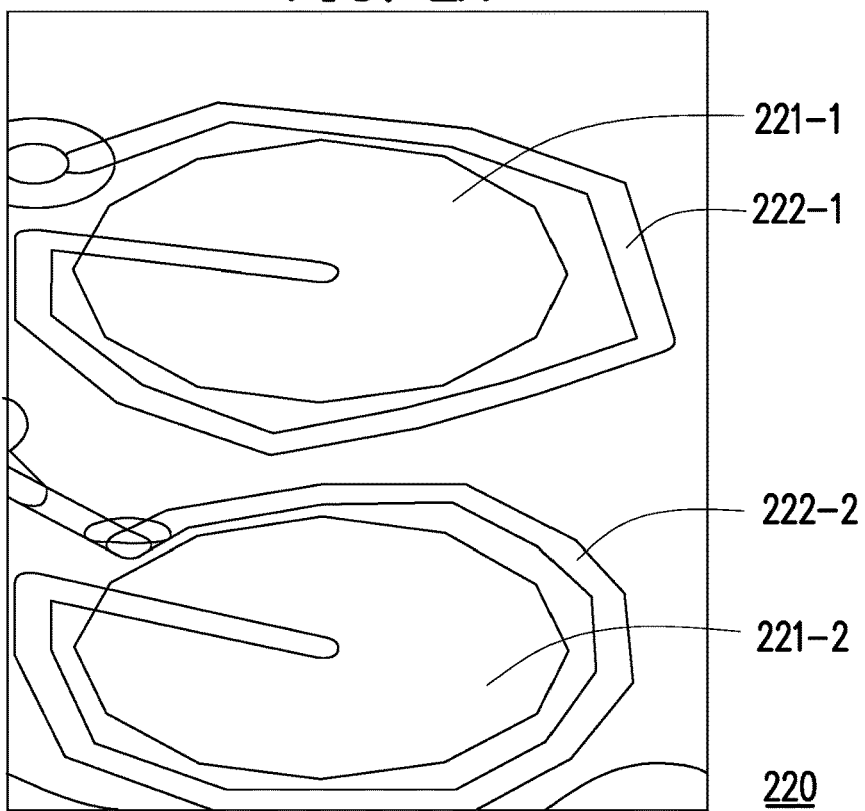

Referring to FIGS. 2A and 2B, FIGS. 2A and 2B respectively illustrate schematic views of different implementation methods of the layout structure according to an embodiment of the disclosure. In FIG. 2A, a layout structure 210 includes bonding pads 211-1 and 211-2 and impedance adjusting wires 212-1 and 212-2. The bonding pads 211-1 and 211-2 and the impedance adjusting wires 212-1 and 212-2 are disposed on a same surface of the circuit board. One end of the impedance adjusting wire 212-1 is electrically connected to the bonding pad 211-1, and another end of the impedance adjusting wire 212-1 may be configured to be connected to a first signal transmission line. One end of the impedance adjusting wire 212-2 is electrically connected to the bonding pad 211-2, and another end of the impedance adjusting wire 212-2 may be configured to be connected to a second signal transmission line. The first signal transmission line and the second signal transmission line may respectively receive and transmit two electrical signals that are differential signals.

In addition, the impedance adjusting wire 212-1 surrounds a periphery of the bonding pad 211-1, and is disposed under a condition of having a first interval distance from the periphery of the bonding pad 211-1. In the implementation method of FIG. 2A, the impedance adjusting wire 212-1 surrounds ½ of a circumference of the bonding pad 211-1. On the other hand, the impedance adjusting wire 212-2 surrounds a periphery of the bonding pad 211-2, and is disposed under a condition of having a second interval distance from the periphery of the bonding pad 211-2. In the implementation method of FIG. 2A, the impedance adjusting wire 212-2 may surround ½ of a circumference of the bonding pad 211-2. The first interval distance and the second interval distance may be the same or different, and the disclosure is not limited thereto.

In FIG. 2B, a layout structure 220 includes bonding pads 221-1 and 221-2 and impedance adjusting wires 222-1 and 222-2. The bonding pads 221-1 and 221-2 and the impedance adjusting wires 222-1 and 222-2 may be disposed on a same surface of the circuit board, too. One end of the impedance adjusting wire 222-1 is electrically connected to the bonding pad 221-1, and another end of the impedance adjusting wire 222-1 may be configured to be connected to the first signal transmission line. One end of the impedance adjusting wire 222-2 is electrically connected to the bonding pad 221-2, and another end of the impedance adjusting wire 222-2 may be configured to be connected to the second signal transmission line. The first signal transmission line and the second signal transmission line may respectively receive and transmit two electrical signals that are differential signals.

In addition, the impedance adjusting wire 222-1 surrounds a periphery of the bonding pad 221-1, and is disposed under a condition of having a first interval distance from the periphery of the bonding pad 221-1. In the implementation method of FIG. 2B, the impedance adjusting wire 222-1 surrounds 1 circumference of the bonding pad 221-1. On the other hand, the impedance adjusting wire 222-2 surrounds a periphery of the bonding pad 221-2, and is disposed under a condition of having a second interval distance from the periphery of the bonding pad 221-2. In the implementation method of FIG. 2B, the impedance adjusting wire 222-2 may surround 1 circumference of the bonding pad 221-2. Similarly, in this implementation method, the first interval distance and the second interval distance may be the same or different, and the disclosure is not limited thereto.

Figure 3:
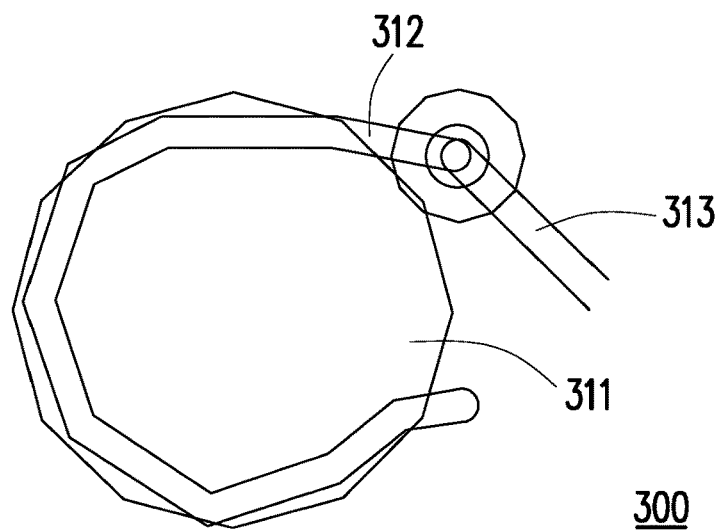
FIG. 3 illustrates a schematic view of another implementation method of the layout structure according to an embodiment of the disclosure.

Referring to FIG. 3, FIG. 3 illustrates a schematic view of another implementation method of the layout structure according to an embodiment of the disclosure. A layout structure 300 includes a bonding pad 311, an impedance adjusting wire 312, and a signal transmission line 313. In this implementation method, the bonding pad 311 and the impedance adjusting wire 312 may be disposed on different surfaces of the circuit board.

Based on the bonding pad 311 and the impedance adjusting wire 312 being disposed on different surfaces of the circuit board, the impedance adjusting wire 312 may be laid out according to a vertical projection of a contour of the bonding pad 311 on the second surface of the circuit board. In this implementation method, the impedance adjusting wire 312 may at least partially overlap with the contour of the bonding pad 311. A length of the impedance adjusting wire 312 may be ¼, ½, or ¾ of a circumference of the bonding pad 311 or substantially equal to the circumference of the bonding pad 311.

Through the layout method of this implementation method, layout areas required by the impedance adjusting wire 312 and the bonding pad 311 may be effectively reduced.

Incidentally, in this implementation method, the impedance adjusting wire 312 and the signal transmission line 313 may be laid out on a same surface of the circuit board, or disposed respectively on different surfaces of the circuit board, and the disclosure is not limited thereto. When the impedance adjusting wire 312 and the signal transmission line 313 are laid out on different surfaces of the circuit board, the impedance adjusting wire 312 and the signal transmission line 313 may be electrically connected to each other through a conductive via.

Figure 4:
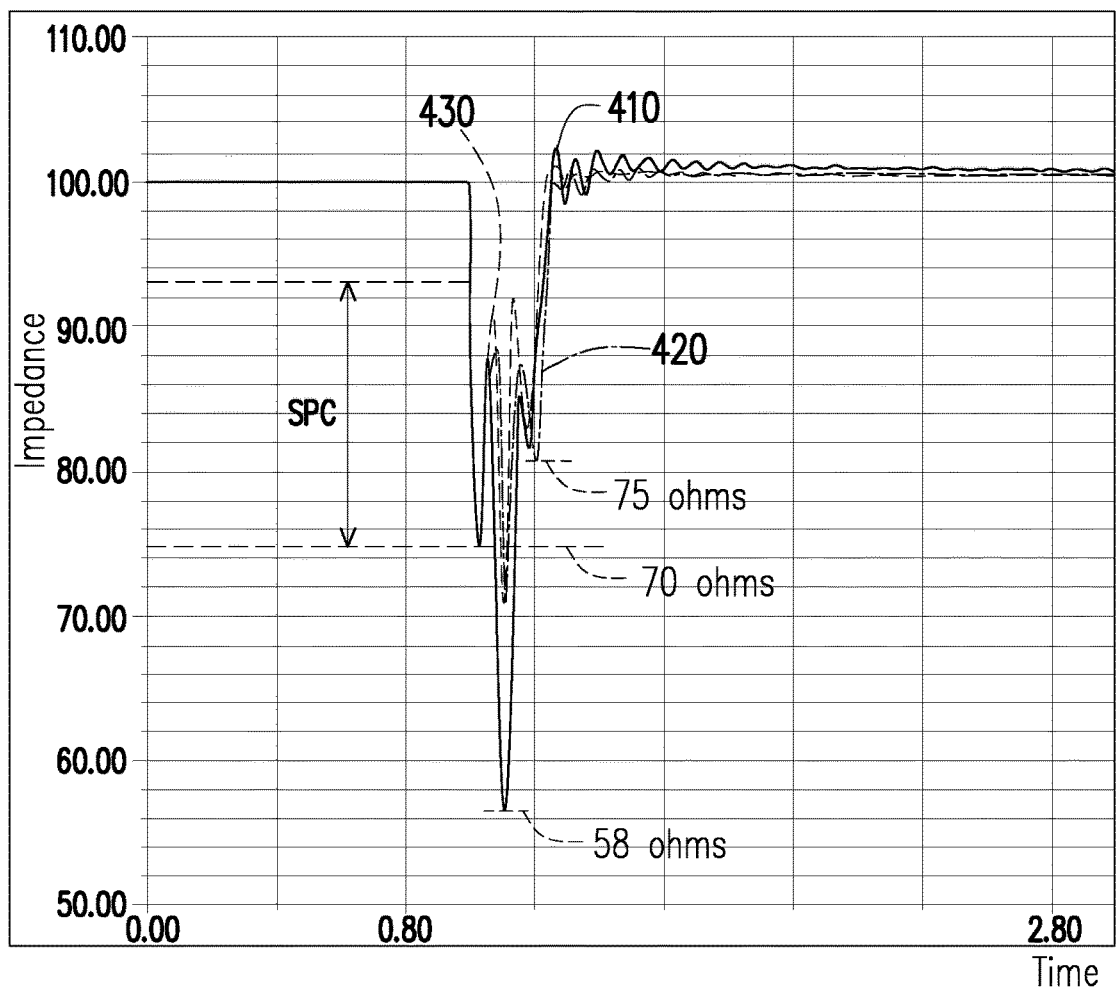
FIG. 4 illustrates a waveform diagram of a time domain reflectometry (TDR) measured according to the layout structure according to an embodiment of the disclosure.

Referring to FIG. 4, FIG. 4 illustrates a waveform diagram of a time domain reflectometry (TDR) measured according to the layout structure according to an embodiment of the disclosure. The time domain reflectometry in FIG. 4 may be measured based on an input signal which is a square wave signal with a period that is equal to 25 picoseconds. A curve 410 represents a time domain reflectance curve when an impedance adjusting wire is not added; a curve 420 represents a time domain reflectance curve when an impedance adjusting wire surrounding half of a circle of a bonding pad is added; a curve 430 represents a time domain reflectance curve when an impedance adjusting wire surrounding ¼ of the circle of the bonding pad is added. Taking a specification SPC set to be between 70 to 93 ohms as an example, when changes are generated in a transmission impedance, according to the curve 410, under the condition of not adding the impedance adjusting wire, the transmission impedance may be reduced to a minimum of 58 ohms, which is much lower than the specification SPC; according to the curve 420, under the condition of adding the half-circle impedance adjusting wire, the transmission impedance may be changed to 75 ohms, which meets the requirements of the specification SPC; according to the curve 430, under the condition of adding the ¼-circle impedance adjusting wire, the transmission impedance may be changed to 70 ohms, which may still meet the requirements of the specification SPC.

Figure 5:
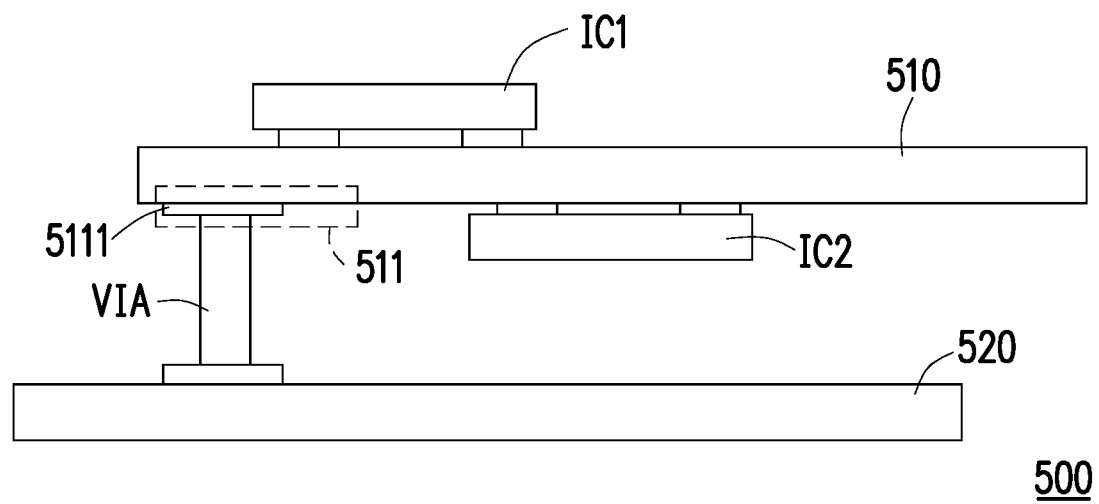
FIG. 5 illustrates a schematic view of a circuit board structure according to an embodiment of the disclosure.

Referring to FIG. 5, FIG. 5 illustrates a schematic view of a circuit board structure according to an embodiment of the disclosure. A circuit board structure 500 includes circuit boards 510 and 520. The circuit board 510 may carry integrated circuits IC1 and IC2. The integrated circuits IC1 and IC2 may be disposed on any surface of the circuit board 510, and the disclosure is not limited thereto. The circuit board 510 has a layout structure 511. The layout structure 511 is connected to the integrated circuit IC2 and configured to receive and transmit signals with the integrated circuit IC2. The layout structure 511 may be constructed according to the multiple embodiments as shown in FIGS. 1 to 3, and will not be repeated herein.

The layout structure 511 has a bonding pad 5111, and the bonding pad 5111 may be electrically connected to a conductive via VIA. Through the conductive via VIA, the circuit boards 510 and 520 may be electrically connected to each other.

In addition, the circuit board 520 in this embodiment may or may not carry an integrated circuit. The designer may make a setting according to needs, and the disclosure is not limited thereto.

Figure 6:
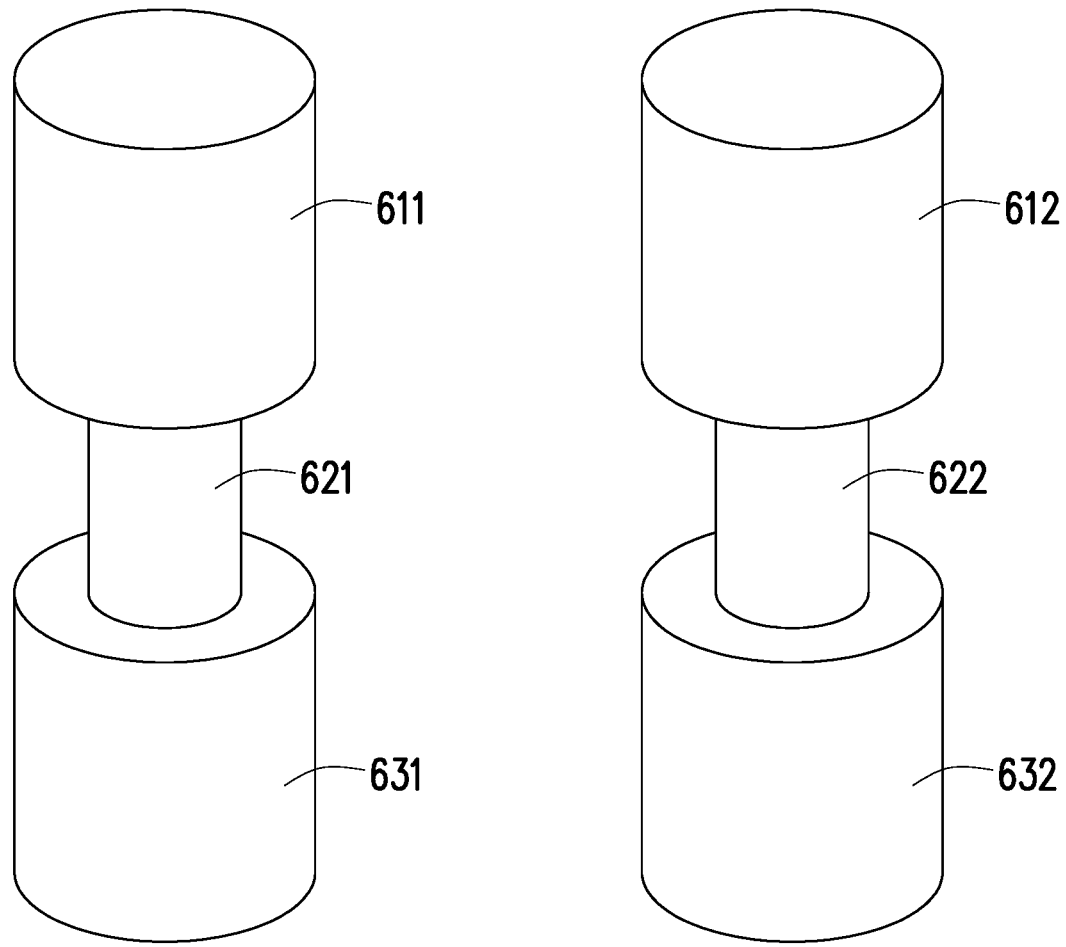
FIG. 6 illustrates a schematic view of a transmission structure of a high-speed transmission interface according to an embodiment of the disclosure.

Referring to FIG. 6, FIG. 6 illustrates a schematic view of a transmission structure of a high-speed transmission interface according to an embodiment of the disclosure. In FIG. 6, a bonding pad 611, a conductive via 621, and a bonding pad 631 are configured to form a first wire structure to transmit a first signal, and a bonding pad 612, a conductive via 622, and a bonding pad 632 are configured to form a second wire structure to transmit a second signal. The first signal and the second signal are differential signals. The bonding pad 611 and the bonding pad 612 may be disposed on the same first circuit board, and the bonding pad 621 and the bonding pad 622 may be disposed on the same second circuit board, and the first circuit board and the second circuit board are different.

In this embodiment, taking the first wire structure as an example, the first wire structure has a self inductance L11 and a mutual inductance L12 generated with the second wire structure. The first wire structure has a self capacitance C11 and a mutual capacitance C22 generated with the second wire structure.

By at least disposing the impedance adjusting wire that partially surrounds the bonding pad in the embodiment of the disclosure, the self inductance L11 may be increased. In addition, the mutual inductance L12 and the mutual capacitance C12 may be reduced, and electric and magnetic fields of signals mutually coupled between transmission lines may be reduced. In the embodiment of the disclosure, an inductive path is generated through the impedance adjusting wire that at least partially surrounds the bonding pad to compensate for a large circuit (for example, the self capacitance C11) generated by a stack structure of a multilayer circuit board. An impedance difference Zdiff between the first wire structure and the second wire structure in this embodiment may be expressed as follows:

$$Zdiff = 2 \times \frac{\sqrt{L11 - L12}}{\sqrt{C11 + C12}}$$

In summary, the circuit board layout structure proposed by the disclosure disposes an impedance adjusting wire between the bonding pad and the signal transmission line. In addition, by laying out the impedance adjusting wire to be disposed along the periphery of the bonding pad and partially surround the bonding pad, reflection that may be generated in the signal transmission process may be reduced, and the quality of the signal transmission may be effectively improved.

What is claimed is:

1. A circuit board layout structure, comprising:
   at least one signal transmission line, disposed on a first circuit board;
   at least one bonding pad, disposed on the first circuit board; and
   at least one impedance adjusting wire, disposed on the first circuit board, electrically connected between the at least one signal transmission line and the at least one bonding pad, wherein the at least one impedance adjusting wire is disposed along a periphery of the at least one bonding pad, and at least partially surrounds the at least one bonding pad,
   wherein the at least one impedance adjusting wire and the at least one bonding pad are disposed on different surfaces of the first circuit board, the at least one impedance adjusting wire is disposed according to a contour of the at least one bonding pad, and the impedance adjusting wire at least partially overlaps with the contour of the at least one bonding pad.

2. The circuit board layout structure according to claim 1, wherein the at least one impedance adjusting wire is disposed according to the contour of the at least one bonding pad.

3. The circuit board layout structure according to claim 1, wherein an impedance provided by the at least one impedance adjusting wire is greater than an impedance provided by the at least one bonding pad.

4. The circuit board layout structure according to claim 1, wherein the at least one impedance adjusting wire surrounds ¼, ½, ¾, or all of an outer edge of the periphery of the at least one bonding pad.

5. The circuit board layout structure according to claim 1, wherein the at least one bonding pad is electrically connected to a second circuit board through a connector.

6. A circuit board structure, comprising:
   a first circuit board, comprising;
     at least one signal transmission line, disposed on h first circuit board;
     at least one bonding pad, disposed on the first circuit board; and
     at least one impedance adjusting wire, disposed on the first circuit board, electrically connected between the at least one signal transmission line and the at least one bonding pad, wherein the at least one impedance adjusting wire is disposed along a periphery of the at least one bonding pad, and at least partially surrounds the at least one bonding pad; and
   a second circuit board, electrically connected to the first circuit board through at least one connector,
   wherein the at least one impedance adjusting wire and the at least one bonding pad are disposed on different surfaces of the first circuit board, the at least one impedance adjusting wire is disposed according to a contour of the at least one bonding pad, and the impedance adjusting wire at least partially overlaps with the contour of the at least one bonding pad.

7. The circuit board structure according to claim 6, wherein the at least one impedance adjusting wire is disposed according to t contour of the at least one bonding pad.

8. The circuit board structure according to claim 6, wherein an impedance provided by the at least one impedance adjusting wire is greater than an impedance provided by the at least one bonding pad.

9. The circuit board structure according to claim 6, wherein the at least one impedance adjusting wire surrounds ¼, ½, or all of an outer edge of the periphery of the at least one bonding pad.

* * * * *